United States Patent
Bovino et al.

(10) Patent No.: US 7,362,616 B2
(45) Date of Patent: Apr. 22, 2008

(54) NAND FLASH MEMORY WITH ERASE VERIFY BASED ON SHORTER EVALUATION TIME

(75) Inventors: Angelo Bovino, Brunico (IT); Rino Micheloni, Turate (IT); Roberto Ravasio, Ponte San Pietro (IT)

(73) Assignee: STMicroelectronics S.r.l., Agrate Brianza(MI) (IT)

( * ) Notice: Subject to any disclaimer, the term of this patent is extended or adjusted under 35 U.S.C. 154(b) by 0 days.

(21) Appl. No.: 11/495,886

(22) Filed: Jul. 28, 2006

(65) Prior Publication Data

US 2007/0030730 A1    Feb. 8, 2007

(30) Foreign Application Priority Data

Jul. 28, 2005   (EP) ................................. 05106972
Jul. 28, 2005   (EP) ................................. 05106975
Jul. 28, 2005   (EP) ................................. 05106976

(51) Int. Cl.
      *G11C 16/06*     (2006.01)
(52) U.S. Cl. ............................ 365/185.2; 365/185.28; 365/185.18
(58) Field of Classification Search ............. 365/185.2, 365/185.28, 185.33
      See application file for complete search history.

(56) References Cited

U.S. PATENT DOCUMENTS

| 4,819,212 A | * | 4/1989 | Nakai et al. ............ 365/185.23 |
| 4,827,452 A | * | 5/1989 | Toyama et al. ............. 365/200 |
| 5,025,417 A | * | 6/1991 | Miyamoto et al. ...... 365/185.23 |
| 5,255,233 A | * | 10/1993 | Izumi ......................... 365/207 |

(Continued)

FOREIGN PATENT DOCUMENTS

EP    1 164 597 A    12/2001

(Continued)

OTHER PUBLICATIONS

Seungjae Lee et al., "2.7-A 3.3V 4Gb Four-Level NAND Flash Meory with 90nm CMOS Technology", Solid-State Circuits Converence, 2004, Digest of Technical Papers, ISSCC. 2004 IEEE International San Francisco, CA, USA Feb. 15-19, 2004, Piscataway, NJ, USA, IEEE, Feb. 15, 2004, pp. 52-61.

(Continued)

*Primary Examiner*—Gene N. Auduong
(74) *Attorney, Agent, or Firm*—Bryan A. Santarelli; Graybeal Jackson Haley

(57)    ABSTRACT

A non-volatile memory device is proposed. The non-volatile memory device includes a plurality of memory cells each one having a programmable threshold voltage, and means for reading a set of selected memory cells with respect to a plurality of reference voltages, for each selected memory cell the means for reading including means for charging a reading node associated with the selected memory cell with a charging voltage, means for biasing the selected memory cell with a biasing voltage, means for connecting the charged reading node with the biased selected memory cell, and means for sensing a voltage at the reading node after a predefined delay from the connection, for at least a first one of the reference voltages the biasing voltage being a first biasing voltage equal to the first reference voltage and the delay being a common first delay, wherein for at least a second one of the reference voltages the biasing voltage is a second biasing voltage different from the second reference voltage, and the delay is a second delay different from the first delay.

35 Claims, 6 Drawing Sheets

U.S. PATENT DOCUMENTS

| | | | |
|---|---|---|---|
| 5,864,503 | A | 1/1999 | Pascucci et al. |
| 5,933,366 | A | 8/1999 | Yoshikawa et al. |
| 6,058,042 | A | 5/2000 | Nobukata et al. |
| 6,128,229 | A | 10/2000 | Nobukata et al. |
| 6,243,290 | B1 | 6/2001 | Kurata et al. |
| 6,304,486 | B1 | 10/2001 | Yano |
| 6,307,785 | B1 | 10/2001 | Takeuchi et al. |
| 6,545,909 | B2 | 4/2003 | Tanaka et al. |
| 6,614,070 | B1 * | 9/2003 | Hirose et al. ............... 257/316 |
| 2002/0126531 | A1 | 9/2002 | Hosono et al. |
| 2003/0156478 | A1 | 8/2003 | Maruyama et al. |
| 2004/0109362 | A1 | 6/2004 | Gongwer et al. |
| 2004/0190337 | A1 | 9/2004 | Chen |
| 2005/0018488 | A1 | 1/2005 | Kim et al. |

FOREIGN PATENT DOCUMENTS

| | | | |
|---|---|---|---|
| EP | 1 288 964 A | 3/2003 | |

OTHER PUBLICATIONS

Ken Takeuchi, et al., "A Multipage Cell Architecture for High-Speed Programming Multilevel NAND Flash Memories", IEEE Journal of Solid-State Circuits, vol. 33, No. 8, Aug. 1998, pp. 1228-1238.

Atsushi Nozoe, et al., "A 256-Mb Multilevel Flash Memory with 2-MB/s Program Rate for Mass Storage Applications", IEEE Journal of Solid-State Circuits, vol. 34, No. 11, Nov. 1999, pp. 1544-1550.

Tae-Sung Jung, et al., "A 117-mm2 3.3-V Only 128-MB Multilevel NAND Flash Memory for Mass Storage Applications", IEEE Journal of Solid-State Circuits, vol. 31, No. 11, Nov. 1996, pp. 1575-1583.

European Search Report for EP 05 10 6972 dated Jan. 18, 2006.
European Search Report for EP 05 10 6976 dated Jan. 16, 2006.
European Search Report for EP 05 10 6975 dated Jan. 26, 2006.

* cited by examiner

NAND FLASH MEMORY WITH ERASE VERIFY BASED ON SHORTER EVALUATION TIME

CROSS REFERENCE TO RELATED APPLICATIONS

This application is related to U.S. patent application Ser. Nos. 11/495,874 entitled PAGE BUFFER FOR MULTI-LEVEL NAND PROGRAMMABLE MEMORIES and 11/495,876 entitled DOUBLE PAGE PROGRAM, which have a common filing date and owner and which are incorporated by reference.

PRIORITY CLAIM

This application claims priority from European patent application Nos. EP05106972.2, filed Jul. 28, 2005, EP05106976.3, filed Jul. 28, 2005, and EP05106975.5, filed Jul. 28, 2005, which are incorporated herein by reference.

TECHNICAL FIELD

An embodiment of the present invention relates to the field of non-volatile memory devices. More specifically, an embodiment of the present invention relates to the reading of a non-volatile memory device.

BACKGROUND

Non-volatile memory devices are used in a number of applications, whenever data must be retained even if a power supply is off. Flash memories are a particular type of non-volatile memory device, in which each cell can be electrically programmed, but a large number of cells (which form a sector) must be erased at the same time. Typically, each cell is formed by a floating gate MOS transistor that stores a logic level defined by its threshold voltage (which depends on the electric charge stored in the corresponding floating gate). In particular, in a flash memory device with NAND architecture the cells are arranged in strings, each one consisting of a set of cells connected in series. An advantage of this architecture is the reduced area occupation (essentially due to the low number of electrical contacts and to the small size of the cells). This makes the NAND memory devices particularly advantageous in a number of applications (for example, for memory cards).

In order to further reduce the complexity of the NAND memory devices, the cells of a selected sector are generally erased by applying a single blind erasing pulse, which is dimensioned so as to lower their threshold voltages below a reference reading voltage (typically, 0V). Moreover, the NAND memory devices implement a decoding system that is able to bias the various cells selectively with positive voltages only (i.e., equal or higher than zero).

A problem of the NAND memory devices is due to the capacitive coupling between the floating gates of adjacent cells; such effect may make the threshold voltage of each cell dependent on the electric charge stored in the floating gates of the adjacent cells.

The capacitive coupling effect modifies the threshold voltage of each cell whenever the adjacent cells are programmed. The suffered variation increases with the increment of the threshold voltages of the adjacent cells during the programming operation. Thus, the problem is particularly serious when the adjacent cells to be programmed start from very low threshold voltages. As a result, this variation may cause errors during the reading operations.

In order to limit the capacitive coupling effect, it would be desirable to increase the threshold voltages of the erased cells; for example, it is possible to shift the threshold voltages of the erased cells by applying a soft programming pulse (of reduced amplitude and duration). However, after this operation it is necessary to verify that the cells are still erased. For this purpose, the cells should be read with respect to the reading voltage with a negative margin (so as to ensure that they are not approaching the reading voltage beyond a safety limit).

The above-described operation requires the biasing of the cells to be read with a negative voltage (so as to make it possible to discriminate whether their threshold voltages are actually lower than the desired value). Therefore, this operation is inherently incompatible with the structure of the NAND memory devices known in the art (wherein only a positive decoding system is available).

SUMMARY

An embodiment of the present invention proposes a solution, which is based on the idea of emulating multiple reference voltages during a reading operation by using different reading times.

Particularly, an embodiment of the present invention proposes a non-volatile memory device. The memory device includes a plurality of memory cells, each one having a programmable threshold voltage. The memory device further includes means for reading a set of selected memory cells (such a page) with respect to a plurality of reference voltages. For each selected memory cell, the means for reading includes means for charging a reading node associated with the selected memory cell (such as its bit line) with a charging voltage. Means for biasing the selected memory cell with a biasing voltage is provided. Moreover, means is available for connecting the charged reading node with the biased selected memory cell. Means is used for sensing a voltage at the reading node after a predefined delay from the connection. For at least a first one of the reference voltages (such as 0V), the biasing voltage is equal to the first reference voltage, and the delay is a common first delay. For at least a second one of the reference voltages (such as −1V), the biasing voltage is a second biasing voltage different from the second reference voltage (such as 0V), and the delay is a second delay different from the first delay.

In an embodiment of the invention, a shorter delay is used.

Advantageously, the second biasing voltage may be equal to the first reference voltage.

In a further embodiment of the invention, the selected cells are read with respect to a third reference voltage by applying a third biasing voltage (different from the second biasing voltage), but using the same delay.

Preferably, each biasing voltage has a predefined sign (such as positive) or a null value, while the second and/or the third reference voltage has the opposite sign (such as negative).

Typically, the first reference voltage is a reading voltage (such as 0V), the second reference voltage is the reading voltage with a margin (such as −1V) and the third reference voltage is the reading voltage with a lower margin (such as −0.5V).

In an embodiment of the invention, the proposed solution is used for soft-programming the erased cells so as to shift their threshold voltages towards the reading voltage until they reach the second reference voltage (i.e., −1V).

The proposed solution may be applied to a non-volatile memory device with NAND architecture.

As a further enhancement, it is verified that the threshold voltages of the soft-programmed cells are still lower than the third reference voltage (i.e., −0.5V).

Another embodiment of the present invention provides a corresponding method for reading a non-volatile memory device.

One or more embodiments of the invention, however, as well as further features and advantages thereof, will be best understood by reference to the following detailed description, given purely by way of a non-restrictive indication, to be read in conjunction with the accompanying drawings.

DETAILED DESCRIPTION

Figure 1:
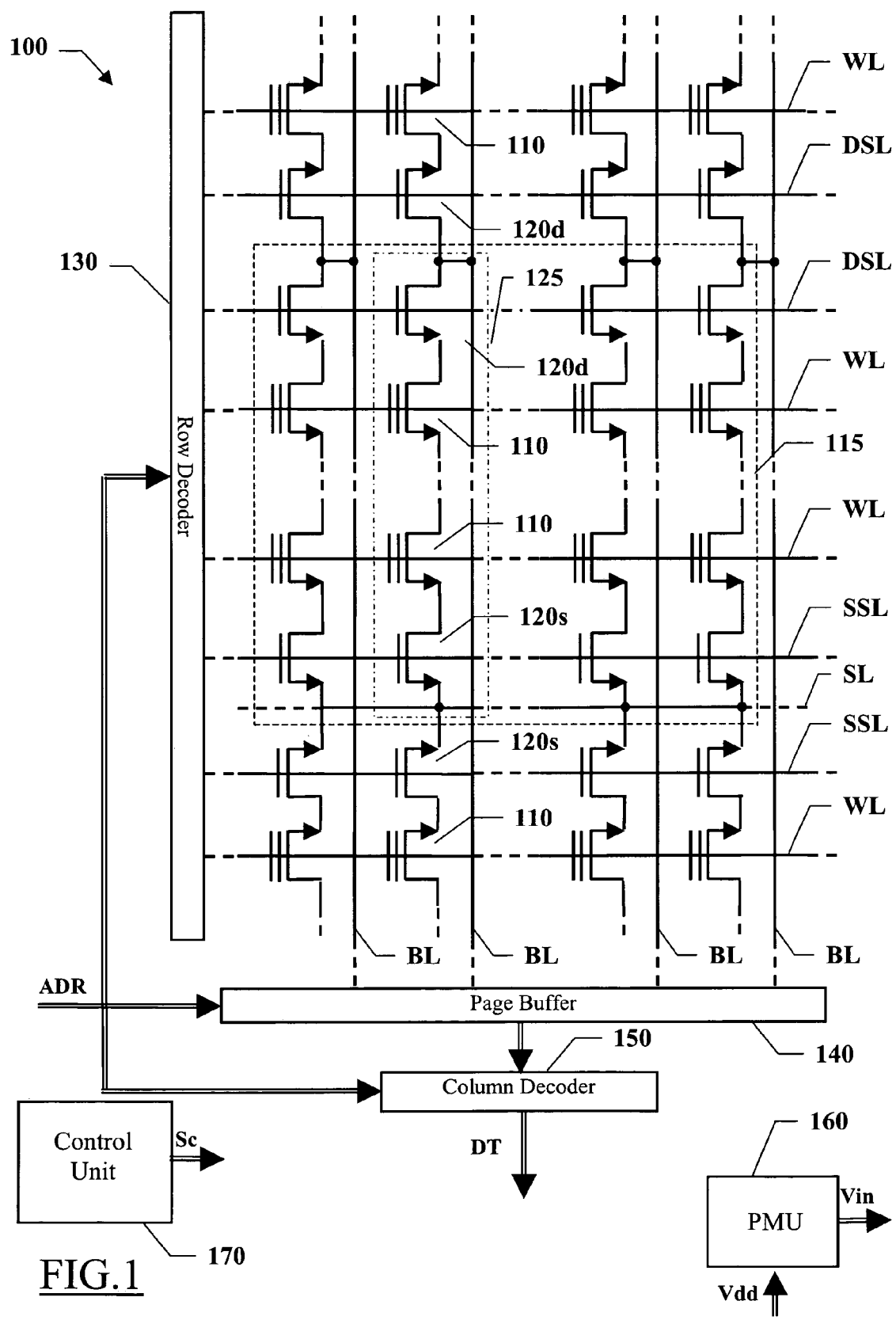
FIG. 1 is a schematic block diagram of a memory device in which the solution according to an embodiment of the invention can be used.

With reference in particular to FIG. 1, a non-volatile semiconductor memory device of the flash type 100 is shown. The memory device 100 includes a matrix of cells 110, typically realized by floating-gate MOS transistors. The matrix includes one or more sectors 115, each one being individually erasable; in particular, all the cells 110 are formed in a common body region of a chip of semiconductor material (wherein the memory device 100 is integrated).

In an erased condition each cell 110 has a low threshold voltage (to which a logic level "1" is typically associated). The cell 110 is programmed by injecting electrons into its floating-gate; in this condition the cell 110 has a high threshold voltage (to which a logic level "0" is typically associated). Therefore, when the cell 110 is biased for reading, it is conductive if erased or it is non-conductive if programmed.

The cells 110 are arranged in a plurality of rows and columns. The memory device 100 is of the NAND type. In this architecture, each sector 115 includes a plurality of strings 125; each string 125 is formed by a set of cells 110 (typically 16) that are connected in series between two select transistors 120s and 120d.

In detail, an intermediate cell 110 of the string 125 has the drain terminal connected to the source terminal of the upper cell 110 and the source terminal connected to the drain terminal of the lower cell 110. The lowest cell 110 of the string 125 has the source terminal connected to the drain terminal of the select transistor 120s, while the uppermost cell 110 of the string 125 has the drain terminal connected to the source terminal of the select transistor 120d. Moreover, the select transistor 120s has the source terminal connected to the source terminal of the select transistor 120s of a lower string and the transistor 120d has the drain terminal connected to the drain terminal of the select transistor 120d of an upper string. The gate terminals of the cells 110 of each row are connected to a corresponding word line WL. The drain terminals of the select transistors 120d of the strings of each column are connected to a corresponding bit line BL. The gate terminals of the select transistors 120d positioned on a same row are connected to a corresponding drain select line DSL; likewise, the gate terminals of the select transistors 120s positioned on a same row are connected to a corresponding source select line SSL. Moreover, the source terminals of all the select transistors 120s are connected to a common source line SL, which is typically maintained at a reference voltage (or ground).

The cells 110 belonging to each row are logically grouped in two pages; in detail, a first page is formed by the cells 110 having an even position and a second page is formed by the cells having an odd position. The memory device 100 receives an address ADR for selecting a desired page. A portion of the address ADR is supplied to a row decoder 130 that selects the word line WL of the desired page, and the drain select line DSL and the source select line SSL of the corresponding strings 125. Another portion of the address ADR (1 bit) is supplied to a page buffer 140. The page buffer 140 selects the bit lines BL of the desired page, that is, the even ones or the odd ones; the page buffer 140 then reads (or writes) the cells 110 of the selected page. The page buffer 140 interfaces with a column decoder 150; the column decoder 150 receives a further portion of the address ADR, and outputs a corresponding word DT selected in the page that has been read by the page buffer 140.

The memory device 100 further includes a power management unit (PMU) 160 and a control unit 170. The PMU 160 supplies the voltages that are used for performing the various operations on the memory device 100, for example, from approximately 0V to approximately 20V (referred to as a whole with Vin); the voltages Vin are generated (for example, through charge pumps) starting from a power supply voltage Vdd supplied from the outside (typically, 1.8/3V). The control unit 170 provides the control signals (referred to as a whole with Sc) that are used for driving the various components of the memory device 100.

Figure 2A:
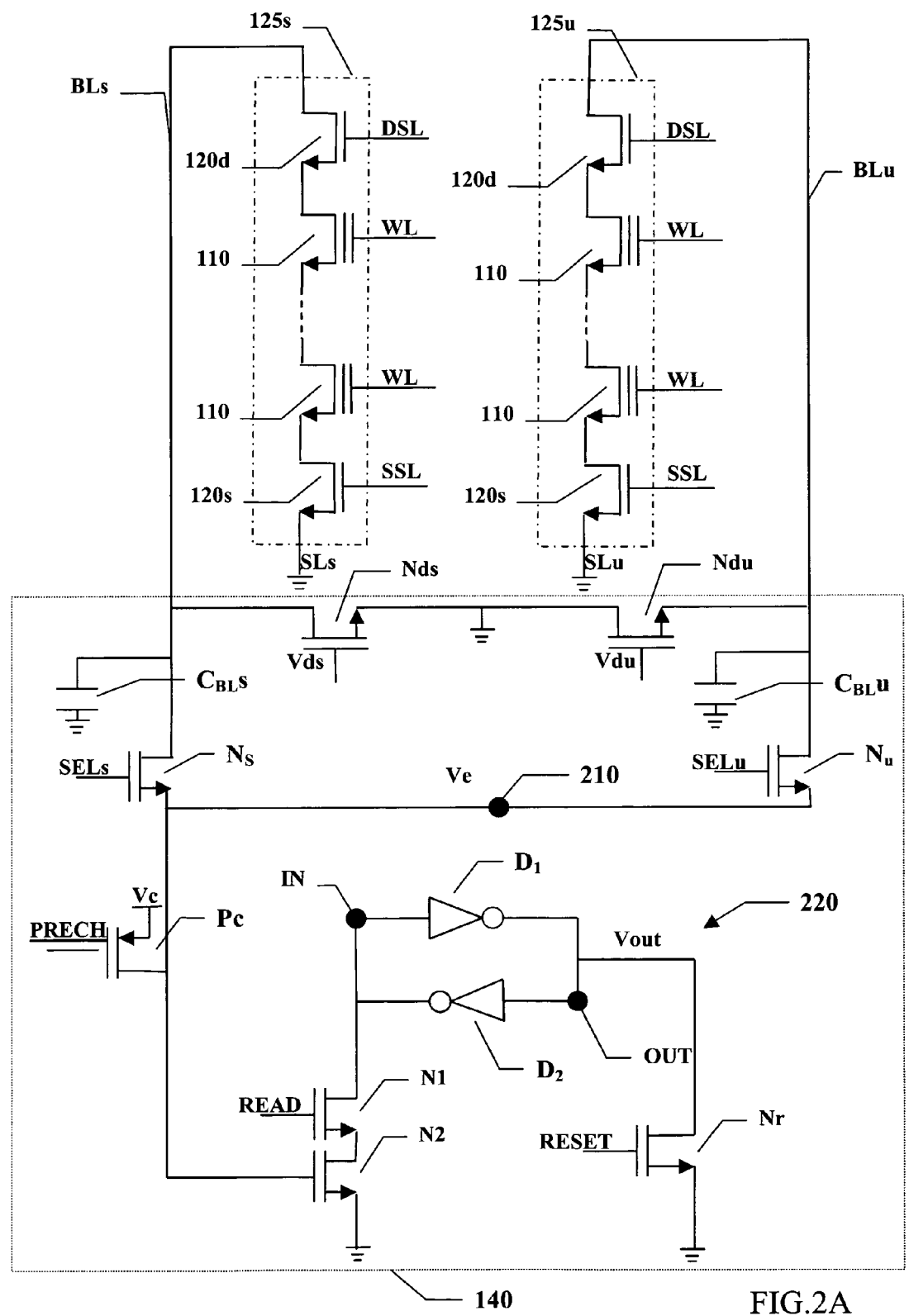
FIG. 2A details a portion of the memory device of FIG. 1.

Referring to FIG. 2A, a more detailed representation of a portion of the above described memory device is shown. Particularly, the page buffer 140 includes a read unit for each pair of (even and odd) bit lines (the components used for writing the selected cells are omitted for sake of simplicity). Particularly, a selected string is denoted with 125s and an unselected string is denoted with 125u (from now on, the suffixes "s" and "u" will be added to the references of the circuital components to discriminate the ones associated with the selected string 125s from the ones associated with the unselected string 125u). The strings 125s and 125u have the source lines SLs and SLu connected to a ground terminal.

Two NMOS transistors Ndu and Nds are used for discharging the bit lines BLu and BLs, respectively. In particular, the NMOS transistors Ndu and Nds have the source terminal and the drain terminal, respectively, that are connected together to the ground terminal. Moreover, the NMOS transistor Nds has the drain terminal connected to the bit line BLs, whereas the NMOS transistor Ndu has the source terminal connected to the bit line BLU. The NMOS transistors Nds and Ndu receive at their gate terminals discharging voltages Vds and Vdu, respectively.

Two further NMOS transistors Ns and Nu have the drain terminals connected to the bit lines BLs and BLu, respectively, and the source terminals connected to a common node 210 (providing an evaluation voltage Ve); the gate terminals of the NMOS transistors Ns and Nu receive a select signal SELs and a further select signal SELu=$\overline{\text{SELs}}$ respectively, (corresponding to the relevant bit of the received address). The stray capacitances of the bit lines BLs and BLu are represented by corresponding capacitors $C_{BL}s$ and $C_{BL}u$, connected between the drain terminal of the NMOS transistor Ns and Nu, respectively, and the ground terminal.

The page buffer 140 includes a PMOS transistor Pc that is used to pre-charge the node 210 at the beginning of the reading operation. The transistor Pc has the drain terminal connected to the node 210 and the source terminal connected to a terminal providing a pre-charging voltage Vc (for example, 2.1V). The gate terminal of the PMOS transistor Pc receives a pre-charging signal $\underline{\text{PRECH}}$ (from the Control Unit); the pre-charging signal $\underline{\text{PRECH}}$ is underlined to denote that it is asserted at the low logic level (for example, ground) and deasserted at the high logic level (for example, Vdd).

The page buffer 140 further includes a latch 220 that is used to read the logic level stored in the selected cell 110. More in detail, the latch 220 is formed by two inverters D1 and D2. The input terminal of the inverter D1 and the output terminal of the inverter D2 are connected together to define an input node IN of the latch 220; likewise, the output terminal of the inverter D1 and the input terminal of the inverter D2 are connected together to define an output node OUT of the latch 220, which provides an output signal Vout (representing the read logic level). An NMOS transistor Nr is used to reset the latch 220. For this purpose, the transistor Nr has the drain terminal connected to the output node OUT and the source terminal connected to the ground terminal; the gate terminal of the NMOS transistor Nr is controlled by a reset signal RESET (from the Control Unit).

The latch 220 is set by means of two NMOS transistors N1 and N2 that are connected in series. Particularly, the NMOS transistor N1 has the drain terminal connected to the input node IN and the source terminal connected to the drain terminal of the NMOS transistor N2; the source terminal of the NMOS transistor N2 is connected to the ground terminal. The gate terminal of the NMOS transistor N2 is controlled by the voltage at the node 210, while the gate terminal of the transistor N1 is controlled by a latching signal READ (from the Control Unit).

Figure 2B:
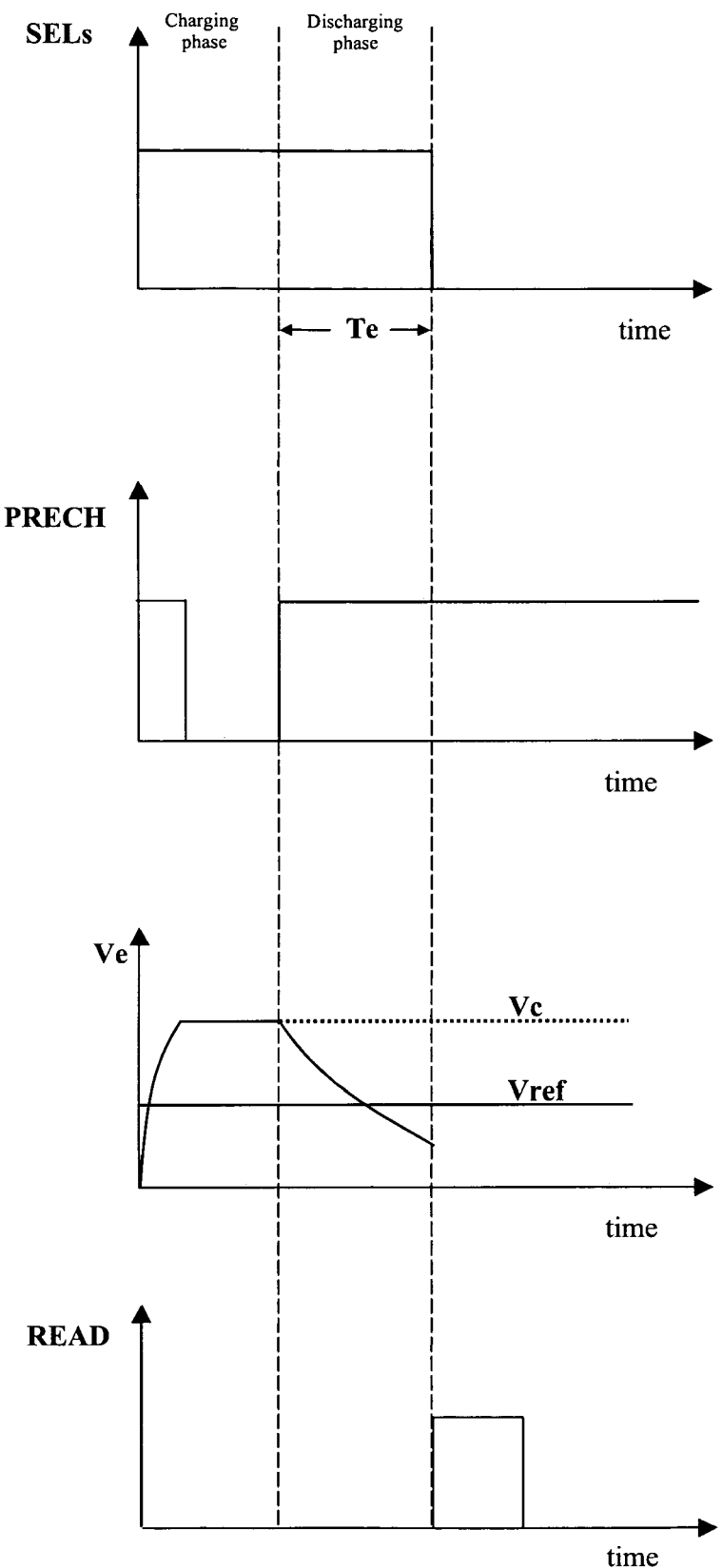
FIG. 2B shows exemplificative time diagrams relating to operation of this portion of the memory device in FIG. 2A according to an embodiment of the invention.

In FIG. 2B there are shown the signals SEL, PRECH, Ve and READ, over time.

Considering now FIGS. 2A and 2B together, a reading operation of a selected cell 110 of the string 125s will be described. Before starting this operation, the reset signal RESET is brought to the high logic level so as to switch on the NMOS transistor Nr (thereby bringing the output node OUT to ground); as a result, the latch 220 is reset and the output signal Vout reaches the low logic level.

During the reading operation the select signal SELu at the low logic level switches off the NMOS transistor Nu so as to maintain the string 125u always disconnected. At the same time, the control signal SELs at the high logic level switches on the NMOS transistor Ns (so as to connect the bit line BLs of the selected string 125s to the node 210).

At the beginning of a charging phase the pre-charging signal PRECH is asserted so as to switch on the PMOS transistor Pc (while the select transistors 120s and 120d remain off). In such a way, the bit line BLs (i.e., the capacitor $C_{BL}s$) is charged to the pre-charging voltage Vc (2.1V). The charging phase has a length (for example, ranging from approximately 3 μs to approximately 5 μs) ensuring that the evaluation voltage Ve at the node 210 has reached the precharging voltage Vc (apart from the voltage drop at the NMOS transistor Ns).

Subsequently, during a discharging phase, the pre-charging signal PRECH switches to the high logic level (in such a way, the PMOS transistor Pc turns off). The (drain and source) select lines DSL and SSL of the strings corresponding to the selected page are brought to the supply voltage Vdd (1.8/3V); in this way, the corresponding select transistors 120d and 120s switch on. At the same time, the word line WL of the selected page is brought to a reference reading voltage $V_R$ (for example, $V_R$=0V) comprised between the threshold voltage of the erased cells and of the programmed cells; the other word lines WL of those strings are brought to a closing voltage Vpass (for example, 5V) so that the corresponding cells 110 are always conductive (irrespective of their threshold voltages). When the selected cell 110 is programmed it is not conductive (since its threshold voltage is higher than the reading voltage $V_R$); therefore, the evaluation voltage Ve of the node 210 remains at the value Vc (denoted with a dotted line in the Figure). Vice versa, when the selected cell 110 is erased it is conductive (since its threshold voltage is lower than the reading voltage $V_R$); therefore, the capacitor $C_{BL}s$ discharges towards ground.

The latching signal READ is brought at the high logic level at the end of an evaluation time Te (for example, 10 μs), which is substantially longer than the length of the above mentioned discharging process. The signal READ at the high logic level switches on the transistor N1. If the evaluation voltage Ve is at the high logic level (selected cell 110 programmed), the NMOS transistor N2 is on as well so that the input node IN is brought the low logic level (because both the transistors N1 and N2 are conductive); as a result, the latch 220 is set and the output signal Vout switches to the high logic level. Conversely, if the selected cell 110 is erased the evaluation voltage Ve is lower than a comparing voltage Vref (consisting of the threshold voltage of the transistor N2, such as 1.3V), so that the NMOS transistor N2 is not conductive; in this case, the input node IN remains at the high logic level and the output signal Vout remains at the low logic level.

It is possible to read the selected cell 110 with respect to a different reference voltage (for example, with a negative value) by simply changing the length of the evaluation time Te (for the same biasing of the selected word line WL).

Indeed, the discharging time of the selected bit line BLs (when the selected cell 110 is erased) depends on the resistance of the selected cell 110, which in turn depends on its threshold voltage.

Figure 3:
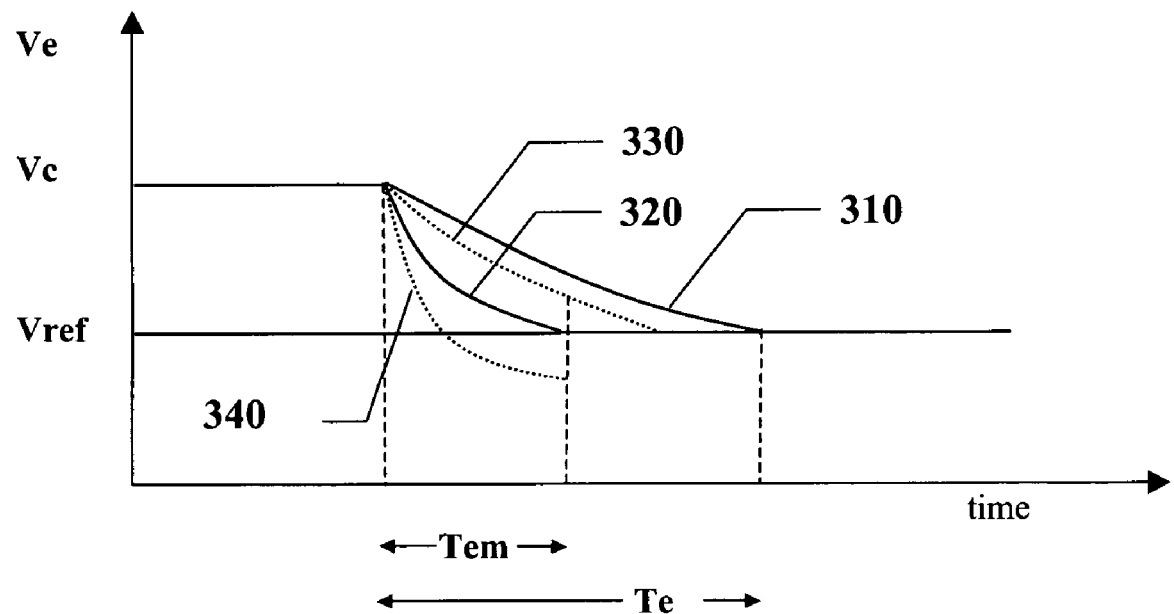
FIG. 3 shows illustrative time diagrams explaining the principle on which the solution according to an embodiment of the present invention is based.

For example, as shown in the FIG. 3, a discharge curve 310 of a selected cell having a threshold voltage exactly equal to the reading voltage $V_R$ (0V) reaches the comparing voltage Vref at the end of the evaluation time Te. If the selected cell has a lower threshold voltage (for example, −1V) it is more conductive; therefore, the selected bit line BLs discharges in a shorter time (so as to reach the comparing voltage Vref in advance), as shown by the discharge curve 320.

As a result, it is possible to read the selected cell with respect to a different reference voltage ($V_{Rm}$=1V) by using an evaluation time Tem (Tem<Te) corresponding to the intersection of the discharge curve 320 with the line Ve=Vref.

Indeed, if the selected cell has a threshold voltage higher than the reference voltage $V_{Rm}$ (discharge curve 330), at the end of the evaluation time Tem the evaluation voltage Ve will be higher than the comparing voltage Vref (and the output voltage Vout is at the low logic level), whereas if the selected cell has a threshold voltage lower than the reference voltage $V_{Rm}$ (discharge curve 340), at the end of the evaluation time Tem the evaluation voltage Ve will be lower than the comparing voltage Vref (and the voltage Vout is at the high logic level).

In this way, it is possible to read the selected cell with respect to any desired negative reference voltage by applying a null (or positive) biasing voltage to the selected word line.

For example, this feature can be exploited for shifting the threshold voltages of the erased cells towards less negative values.

Figure 4:
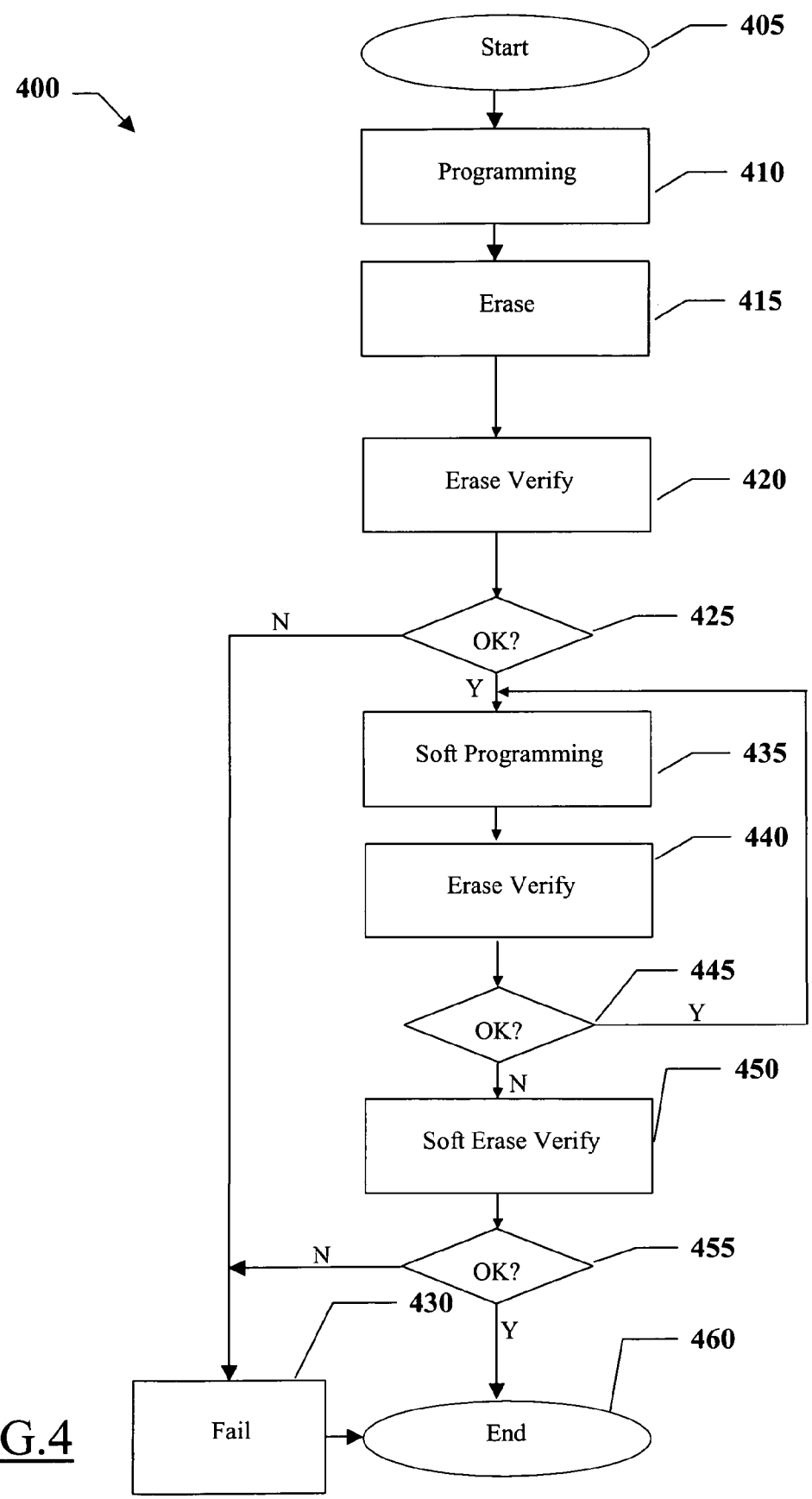
FIG. 4 shows a flow chart describing an erasing procedure of the memory device according to an embodiment of the present invention.

Referring now to FIG. 4, there is represented a method 400 that discloses an erasing algorithm of a selected sector of cells according to an embodiment of the invention. The method 400 starts at the block 405 and then moves to the block 410, wherein all the cells of the sector are programmed (in order to guarantee a uniform aging thereof). In this phase the drain and source select lines of all the strings are brought to the supply voltage Vdd, in order to switch on the relative select transistors; moreover, all the bit lines are brought to the voltage 0V, and a blind programming pulse is applied at all the word lines (for example with a value 19V-20V and a time duration of about 10 μs).

The block 410 is followed by the block 415, wherein all the cells of the sector are erased by means of a blind erasing pulse. In particular, the selected word lines are brought to the voltage 0V (while the other word lines are left floating); moreover, a voltage pulse is applied to the body region, for example, with a ramp pattern that starting from 0V reaches 19V in 800 μs, and then remains constant for a period typically equal to 200 μs. In such a way, the threshold voltage of each cell should be brought under the reading voltage $V_R$ (0V).

Then, the method 400 moves to the block 420 wherein the sector is read with respect to a reference guard voltage Vga equal to the reading voltage with a negative margin (for example, −1V). For this purpose, the same operations described in the following are reiterated for each block of cells of the sector; the block consists of the strings connected to the selected bit lines, which are associated with the pair of select lines identified by the provided address. Particularly, the drain and source select lines of the block are brought to the supply voltage Vdd and all the word lines of the block are brought to the reading voltage $V_R$ (0V).

However, the reading operation is performed with a shorter evaluation time Teg, which corresponds to the time that a generic cell having a threshold voltage equal to the guard voltage Vga spends for discharging the corresponding bit line from the voltage Vc (2.1V) to the comparing voltage Vref (1.3V).

In such a way, as described above, at the end of the evaluation time Teg, the voltage at the bit line of each string will be higher than the comparing voltage Vref if the threshold voltages of all its cells are higher than the guard voltage Vga and it will be lower in the opposite case; this allows discriminating such strings with respect to the guard voltage Vga on the basis of the read logic level ("1" or "0", respectively).

It should be noted that by using the evaluation time Teg it is not necessary a negative decoding (for driving the selected word lines to the guard voltage Vga). This allows using a decoding system of only positive (or null) voltages, with a reduced area occupation on the chip.

Then, the method 400 moves to the block 425, wherein it verifies if all the cells of the sector are erased (with respect to the guard voltage Vga).

If at least one cell is not erased (i.e., at least one low logic level has been read in the preceding step), the sector is set as failed at the block 430; vice versa the method 400 enters a loop, which starts at the block 435, wherein a soft programming pulse is applied to all the cells of the sector; for example, such pulse has a time duration of 10 μs and a value of 13V-14V. As a result, the distribution of the threshold voltages of the erased cells shifts to higher values (as better described in the following).

Successively, at the block 440 each block of the sector is again read with respect to the reference guard voltage Vga. The operations at the block 440 are the same of the above described operations at the block 420.

Then, the method 400 verifies at the block 445 if all the cells of the sector are still erased (with respect to the guard voltage Vga). If so (i.e., all high logic levels have been read in the preceding steps) the method 400 returns to the block 435 for repeating the above described operations. In particular, for each loop the programming pulse is increased by a fixed amount (for example, 50 mV). Vice versa, when the result at the block 445 is negative (i.e., at least one low logic level has been read), the method 400 moves to the block 450. In this phase, each block of the sector is read with respect to a higher reference guard voltage Vgb (for example, Vgb=−0.5V), which is equal to the reading voltage $V_R$ with a smaller negative margin than the one of the guard voltage Vga. As in the preceding case, the select lines of the block are brought to the supply voltage Vdd and the same evaluation time Teg is used. In this case, however, the word lines of the block are brought to a biasing voltage $V_B$ that is shifted according to the difference between the guard voltages Vgb and Vga, i.e., $V_B=V_R+(Vgb-Vga)=0-0.5+1=0.5$; in this way, the reading with respect to the higher guard voltage (Vgb) is emulated without the need of changing the evaluation time (Teg).

Then, the method 400 verifies at the block 455 if all the cells of the sector are still erased (with respect to the guard voltage Vgb). If such result is negative (i.e., at least one low logic level has been read in the preceding step), the sector is set as failed at the block 430 and the method 400 reaches the end at the block 460. Vice versa, the method 400 reaches the end at the block 460 directly.

Figure 5A:
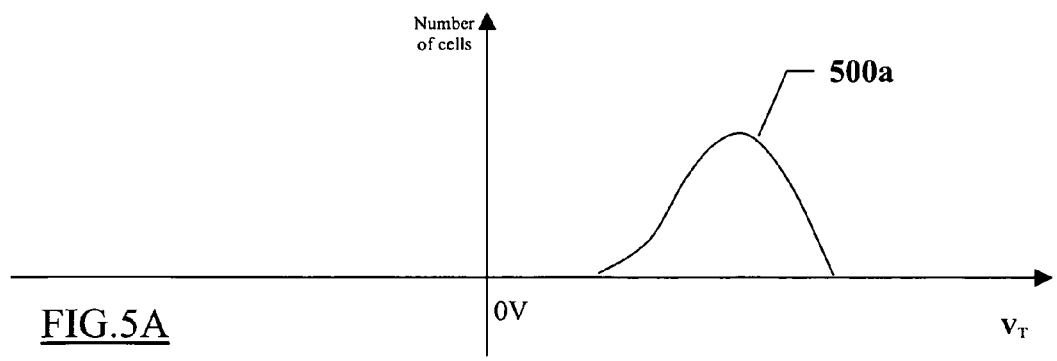
FIGS. 5A through 5D are exemplificative representations of various distributions of the threshold voltages of the erased cells according to an embodiment of the present invention.
Figure 5B:
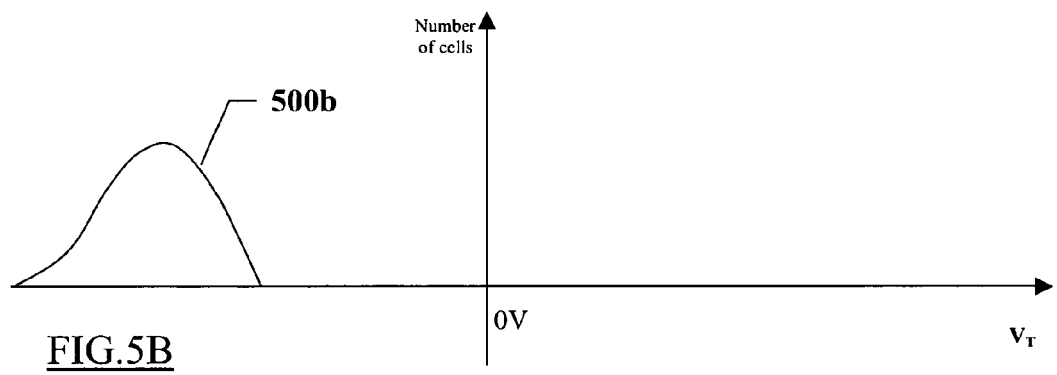
Figure 5C:
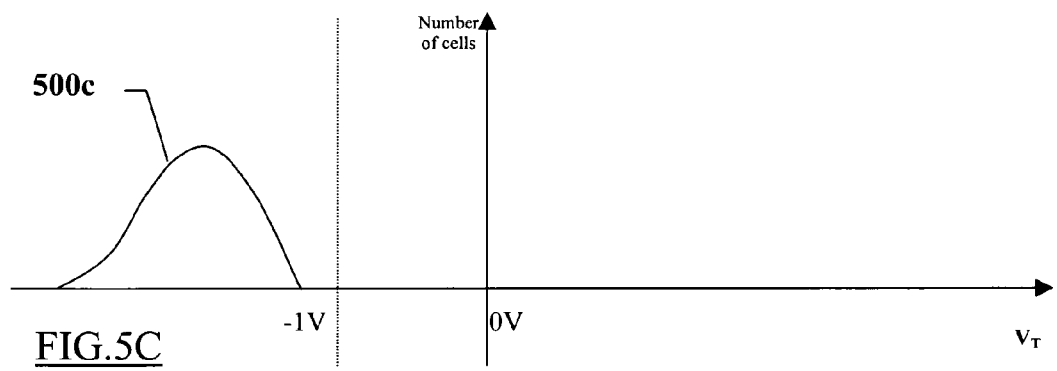
Figure 5D:
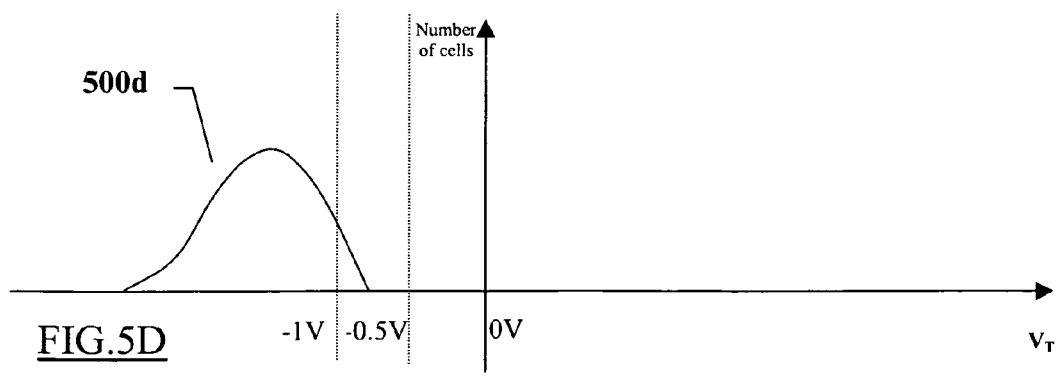

Finally, referring now to FIGS. 4 and 5A-5D together, a schematic representation of the distribution of the threshold voltages ($V_T$) of the cells of the sector at each step of the method 400 is shown. In particular, the FIGS. 5A and 5B show the distribution 500a and 500b of the threshold voltages after the programming operation performed at the block 410 ($V_T>V_R=0$) and the erase operation performed at the block 415 ($V_T<V_R=0$), respectively. The FIG. 5C shows a possible distribution of the threshold voltages 500c after one or more soft-programming operations performed at the block 435. As can be seen, the distribution 500c shifts to the right (at every iteration of the loop 435-445). As shown in FIG. 5D, the loop 435-445 ends when the distribution of the threshold voltages during the erase verify operation performed at the block 445 (denoted with 500d) reaches the guard voltage Vga (−1V). In the example at issue, the distribution 500d does not reach the higher guard voltage Vgb (−0.5V), so that the next (soft) erase verify operation performed at the block 450 will be successful.

Naturally, in order to satisfy local and specific requirements, a person skilled in the art may apply to the solution described above many modifications and alterations. Particularly, although embodiments of the present invention have been described with a certain degree of particularity, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has a different structure or includes equivalent components. Likewise, the described concepts may find equal application with any other structure of the page buffer (or with equivalent means for reading selected cells of the memory device).

Moreover, it is also possible to increase the evaluation time for emulating a higher reference voltage.

In any case, nothing prevents biasing the selected word lines with voltages having any other values.

It should be readily apparent that the reading of the selected cells with respect to the guard voltage of −0.5V may be achieved by using a corresponding further evaluation time (instead of increasing the biasing voltage of the word lines).

Similar considerations apply if the memory device implements a negative decoding system (and the proposed solution is used for reading the selected cells with respect to positive reference voltages). In any case, nothing prevents the use of the same solution also for emulating reference voltages of the same sign.

The values of the reading voltage and of the guard voltages are merely illustrative; moreover, the implementation of the same solution for reading the selected cells with respect to any other reference voltages is contemplated.

It should be noted that although in the preceding description reference has been made to a specific shifting procedure, this is not to be intended in a limitative manner. For example, it is possible to perform the same operations at the level of pages (instead of strings) so as to have an increased accuracy (at the cost of a longer time); alternatively, it is possible to soft-program and verify every block of cells individually (further increasing the accuracy of the result but with an additional waste of time caused by the continual switches between the programming mode and the reading mode of the memory device). In any case, the application of the proposed solution to other operations different from the erase verify is not excluded (for example, during a program verify operation).

Moreover, the soft erase verify operation at the end of the shifting is not strictly necessary and it may be omitted in a simplified implementation (even if this involves the risk of having cells that are not erased any longer at the end of the procedure).

Although embodiments of the invention have been specifically designed for NAND flash memory devices, other embodiments are suitable for implementing in other memory devices such as Dynamic Random Access Memories (DRAM), Static Random Access Memories (SRAM), NOR flash memory devices, phase-change EEPROMs, multi-level memory devices, and the like.

A non-volatile memory according to an embodiment of the invention may be incorporated in a system such as a computer system.

From the foregoing it will be appreciated that, although specific embodiments of the invention have been described herein for purposes of illustration, various modifications may be made without deviating from the spirit and scope of the invention.

What is claimed is:

1. A non-volatile memory device including a plurality of memory cells each one having a programmable threshold voltage, and means for reading a set of selected memory cells with respect to a plurality of reference voltages, for each selected memory cell the means for reading including means for charging a reading node associated with the selected memory cell with a charging voltage, means for biasing the selected memory cell with a biasing voltage, means for connecting the charged reading node with the biased selected memory cell, and means for sensing a voltage at the reading node after a predefined delay from the connection, for at least a first one of the reference voltages the biasing voltage being a first biasing voltage equal to the first reference voltage, and the delay being a common first delay, wherein for at least a second one of the reference voltages the biasing voltage is a second biasing voltage different from the second reference voltage, and the delay is a second delay different from the first delay.

2. The memory device according to claim 1 wherein the second delay is shorter than the first delay.

3. The memory device according to claim 1, wherein the second biasing voltage is equal to the first reference voltage.

4. The memory device according to claim 1, wherein for at least a third one of the reference voltages the biasing voltage is a third biasing voltage different from the second biasing voltage, and the delay is a third delay equal to the second delay.

5. The memory device according to claim 1, wherein each biasing voltage has a first sign or a null value, and wherein the second and/or the third reference voltage has a second sign opposite to the first sign.

6. The memory device according to claim 1, wherein the first reference voltage is a reading voltage, the second reference voltage is the reading voltage with a margin, and the third reference voltage is the reading voltage with a further margin lower than said margin.

7. The memory device according to claim 6, wherein the memory cells are arranged in at least one sector, the memory device further including means for erasing all the memory cells of a selected sector and means for shifting the threshold voltages of the erased memory cells towards the reading voltage, the means for shifting including means for soft-programming the memory cells of the selected sector, means for detecting an ending condition of the soft-programming according to a result of the reading of the cells of the selected sector with respect to the second reference voltage, and means for stopping the soft-programming in response to the ending condition.

8. The memory device according to claim 7 wherein the means for shifting further includes means for verifying the erasure of the soft-programmed cells according to a result of the reading of the soft-programmed cells with respect to the third reference voltage.

9. The memory device according to claim 1, wherein the memory device is of the NAND type.

10. A method for reading a non-volatile memory device including a plurality of memory cells each one having a programmable threshold voltage, the method including the steps of:

reading a set of selected memory cells with respect to a plurality of reference voltages, wherein for each selected cell the step of reading includes:
charging a reading node associated with the selected memory cell with a charging voltage,
biasing the selected memory cell with a biasing voltage,
connecting the charged reading node with the biased selected memory cell, and
sensing a voltage at the reading node after a predefined delay from the connection,
for at least a first one of the reference voltages the biasing voltage being a first biasing voltage equal to the first reference voltage, and the delay being a common first delay,
wherein for at least a second one of the reference voltages the biasing voltage is a second biasing voltage different from the second reference voltage, and the delay is a second delay different from the first delay.

11. A memory, comprising:
a read node;
a first nonvolatile memory cell having a control node, an output node coupled to the read node, and a threshold; and
a threshold-verify circuit coupled to the memory cell and operable to
determine whether the threshold is within a first range by reading a first value on the read node a first predetermined time after coupling a first bias signal to the control node, and
determine whether the threshold is within a second range by reading a second value on the read node a second predetermined time after coupling a second bias signal to the control node.

12. The memory of claim 11 wherein:
the first bias voltage equals the second bias voltage; and
the first predetermined time is unequal to the second predetermined time.

13. The memory of claim 11 wherein:
the first bias voltage equals the second bias voltage;
the first range is lower than the second range; and
the first predetermined time is less than the second predetermined time.

14. The memory of claim 11 wherein:
the first predetermined time equals the second predetermined time; and
the first bias signal is unequal to the second bias signal.

15. The memory of claim 11 wherein:
the first predetermined time equals the second predetermined time;
the first bias signal has a polarity; and
the second bias signal equals zero.

16. The memory of claim 11 wherein:
the first predetermined time equals the second predetermined time; and
the first and second bias signals are unequal and have a same polarity.

17. The memory of claim 11 wherein:
the first predetermined time equals the second predetermined time;
the first range is lower than the second range; and
the first bias signal is less than the second bias signal.

18. The memory of claim 11 wherein the threshold-verify circuit is further operable to:
determine whether the threshold is within a first range by comparing the first value to a predetermined reference signal; and
determine whether the threshold is within a second range by comparing the second value to the predetermined reference signal.

19. The memory of claim 11, further comprising:
a second nonvolatile memory cell coupled between the read node and the output node of the first memory cell; and
wherein the threshold-verify circuit is operable to render the second memory cell conductive while determining whether the threshold is within the first and second ranges.

20. The memory of claim 11, further comprising a threshold-adjust circuit coupled to the first nonvolatile memory cell and operable to adjust the threshold after the threshold-verify circuit determines whether the threshold is within the first range and before the threshold-verify circuit determines whether the threshold is within the second range.

21. The memory of claim 11, further comprising a threshold-adjust circuit coupled to the first nonvolatile memory cell and operable to adjust the threshold before the threshold-verify circuit determines whether the threshold is within the first range.

22. The memory of claim 11, further comprising a threshold-adjust circuit coupled to the first nonvolatile memory cell and operable to:
lower the threshold before the threshold-verify circuit determines whether the threshold is within the first range; and
raise the threshold after the threshold-verify circuit determines whether the threshold is within the first range and before the threshold-verify circuit determines whether the threshold is within the second range.

23. The memory of claim 11, further comprising a threshold-adjust circuit coupled to the first nonvolatile memory cell and operable to:
lower the threshold before the threshold-verify circuit determines whether the threshold is within the first range; and
raise the threshold before the threshold-verify circuit determines whether the threshold is within the second range if the threshold-verify circuit determines that the threshold is within the first range.

24. An integrated circuit, comprising:
a memory, comprising,
a read node,
a first nonvolatile memory cell having a control node, an output node coupled to the read node, and a threshold, and
a threshold-verify circuit coupled to the memory cell and operable to
determine whether the threshold is within a first range by reading a first value on the read node a first predetermined time after coupling a first bias signal to the control node, and
determine whether the threshold is within a second range by reading a second value on the read node a second predetermined time after coupling a second bias signal to the control node.

25. A system, comprising: an integrated circuit, comprising,
a memory, comprising,
a read node,
a first nonvolatile memory cell having a control node, an output node coupled to the read node, and a threshold, and
a threshold-verify circuit coupled to the memory cell and operable to determine whether the threshold is within a first range by reading a first value on the read node a first predetermined time after coupling a first bias signal to the control node, and determine whether the threshold is within a second range by reading a second value on the read node a second predetermined time after coupling a second bias signal to the control node.

26. A method, comprising:

driving a first nonvolatile memory cell with a first signal level;

determining whether a threshold of the memory cell is within a first range a first predetermined time after driving the memory cell;

driving the memory cell with a second signal level; and determining whether the threshold is within a second range a second predetermined time after driving the memory cell with the second signal level.

27. The method of claim 26 wherein the first and second signal levels respectively comprise first and second voltage levels.

28. The method of claim 26 wherein:

determining whether the threshold of the memory cell is within the first range comprises determining whether the threshold is less than or equal to a first voltage level; and determining whether the threshold is within the second range comprises determining whether the threshold is less than or equal to a second voltage level.

29. The method of claim 26 wherein:

determining whether the threshold of the memory cell is within the first range comprises determining whether the threshold is less than or equal to a first voltage level; and determining whether the threshold is within the second range comprises determining whether the threshold is less than or equal to a second voltage level that is greater than the first voltage level.

30. The method of claim 26 wherein:

the first voltage level equals the second voltage level; and the first predetermined time is unequal to the second predetermined time.

31. The method of claim 26 wherein:

the first predetermined time equals the second predetermined time; and the first voltage level is unequal to the second voltage level.

32. The method of claim 26 wherein:

the first predetermined time equals the second predetermined time;

the first voltage level is greater than or equal to zero; and the second voltage level is greater than or equal to zero.

33. The method of claim 26, further comprising rendering conductive a second nonvolatile memory cell that is serially coupled to the first memory cell while determining whether the threshold is within the first and second ranges.

34. The method of claim 26, further comprising increasing the threshold after determining whether the threshold is within the first range and before determining whether the threshold is within the second range.

35. The method of claim 26, further comprising decreasing the threshold before determining whether the threshold is within the first range.

* * * * *